(12) United States Patent
Engelvin et al.

(10) Patent No.: US 8,811,026 B2
(45) Date of Patent: Aug. 19, 2014

(54) LOCKING/UNLOCKING DEVICE FOR ELECTRONIC BOARDS LOCATED IN ONBOARD EQUIPMENT

(75) Inventors: Pierre-Louis Engelvin, Balma (FR); Patrice Lafont, Mons (FR)

(73) Assignee: Airbus Operations S.A.S., Toulouse (FR)

( * ) Notice: Subject to any disclaimer, the term of this patent is extended or adjusted under 35 U.S.C. 154(b) by 141 days.

(21) Appl. No.: 13/536,470

(22) Filed: Jun. 28, 2012

(65) Prior Publication Data

US 2013/0003328 A1    Jan. 3, 2013

(30) Foreign Application Priority Data

Jun. 29, 2011  (FR) ...................................... 11 55836

(51) Int. Cl.
*H05K 5/00* (2006.01)
*H01R 13/62* (2006.01)
*H05K 7/14* (2006.01)

(52) U.S. Cl.
CPC .................................. *H05K 7/1409* (2013.01)
USPC .......................................... 361/759; 439/160

(58) Field of Classification Search
CPC ................................. E05C 19/022; E05C 9/02
See application file for complete search history.

(56) References Cited

U.S. PATENT DOCUMENTS

| | | | |
|---|---|---|---|
| 5,398,164 A | | 3/1995 | Goodman et al. |
| 5,467,254 A | * | 11/1995 | Brusati et al. .................. 361/799 |
| 5,577,922 A | * | 11/1996 | Enomoto et al. .............. 439/157 |
| 5,586,003 A | * | 12/1996 | Schmitt et al. ........... 361/679.58 |
| 5,673,175 A | * | 9/1997 | Carney et al. ............ 361/679.58 |
| 5,782,114 A | * | 7/1998 | Zeus et al. ...................... 70/109 |
| 5,813,710 A | * | 9/1998 | Anderson .................. 292/336.3 |
| 5,829,802 A | * | 11/1998 | Anderson et al. .......... 292/336.3 |
| 5,927,768 A | * | 7/1999 | Dallmann et al. ............. 292/158 |
| 6,015,308 A | * | 1/2000 | Lee et al. ....................... 439/155 |
| 6,246,585 B1 | * | 6/2001 | Gunther et al. ................ 361/759 |
| 6,288,911 B1 | * | 9/2001 | Aoki et al. ..................... 361/801 |
| 6,317,967 B1 | | 11/2001 | Sampson |
| 6,579,029 B1 | * | 6/2003 | Sevde et al. ................ 403/322.3 |

(Continued)

FOREIGN PATENT DOCUMENTS

EP      0 613 336 A1    8/1994

OTHER PUBLICATIONS

French Preliminary Search Report and Written Opinion issued Jan. 19, 2012, in French 1155836, filed Jun. 29, 2011 (with English Translation of Categories of Cited Documents).

*Primary Examiner* — Hoa C Nguyen
*Assistant Examiner* — Xanthia C Cunningham
(74) *Attorney, Agent, or Firm* — Oblon, Spivak, McClelland, Maier & Neustadt, L.L.P.

(57) ABSTRACT

A locking/unlocking device for electronic boards, the boards being configured to be inserted into an electronic cabinet with at least one slotted plate fit into the rack of the electronic cabinet, the device including a substantially rectangular frame supporting at least one locking slide that locks the electronic board onto the slotted plate through the action of a locking element. The device further includes an extracting lever that rotates between a rest and a locking position around a lateral Y1 axis, the extracting lever fitted so that exerting force is possible along the longitudinal X axis between the electronic board, or the frame and the rack, with the locking unit including an extension to be placed outside, opposite the extracting lever along the longitudinal axis X of the board when the two levers are engaged in the locking position.

8 Claims, 5 Drawing Sheets

(56) References Cited

U.S. PATENT DOCUMENTS

| | | | |
|---|---|---|---|
| 6,915,562 B2 * | 7/2005 | Joist et al. | 29/758 |
| 6,916,190 B2 * | 7/2005 | Joist | 439/160 |
| 6,955,550 B2 * | 10/2005 | Schlack | 439/160 |
| 6,956,745 B2 * | 10/2005 | Kerrigan et al. | 361/726 |
| 7,027,309 B2 * | 4/2006 | Franz et al. | 361/798 |
| 7,083,447 B2 * | 8/2006 | Greiser | 439/160 |
| 7,172,441 B2 * | 2/2007 | Schlack | 439/152 |
| 7,203,067 B2 * | 4/2007 | Beall et al. | 361/726 |
| 7,245,499 B2 * | 7/2007 | Stahl et al. | 361/754 |
| 7,292,457 B2 * | 11/2007 | DeNies et al. | 361/801 |
| 7,394,664 B1 * | 7/2008 | Chang | 361/801 |
| 7,408,788 B2 * | 8/2008 | Rubenstein | 361/801 |
| 7,430,115 B2 * | 9/2008 | Liu et al. | 361/679.33 |
| 7,463,494 B2 * | 12/2008 | Downing et al. | 361/798 |
| 8,014,156 B2 * | 9/2011 | Signer et al. | 361/752 |
| 8,203,851 B2 * | 6/2012 | Boetzer | 361/801 |
| 2002/0071254 A1 * | 6/2002 | Tien | 361/727 |
| 2003/0107878 A1 * | 6/2003 | Kaminski | 361/759 |
| 2003/0161118 A1 * | 8/2003 | Bovell | 361/759 |
| 2003/0172523 A1 * | 9/2003 | Joist et al. | 29/758 |
| 2003/0214790 A1 * | 11/2003 | Hanson | 361/747 |
| 2004/0008501 A1 * | 1/2004 | Barringer et al. | 361/801 |
| 2005/0243533 A1 * | 11/2005 | Malone et al. | 361/801 |
| 2007/0236899 A1 * | 10/2007 | Dalisay | 361/754 |
| 2009/0000117 A1 * | 1/2009 | Oila | 29/876 |
| 2009/0296358 A1 * | 12/2009 | Tsai | 361/759 |
| 2010/0091467 A1 * | 4/2010 | Wu | 361/747 |
| 2010/0134986 A1 * | 6/2010 | Hecht et al. | 361/747 |
| 2010/0134987 A1 * | 6/2010 | Furholzer | 361/747 |
| 2010/0188824 A1 * | 7/2010 | Benedetto et al. | 361/747 |
| 2010/0264673 A1 * | 10/2010 | Baic | 292/158 |

* cited by examiner

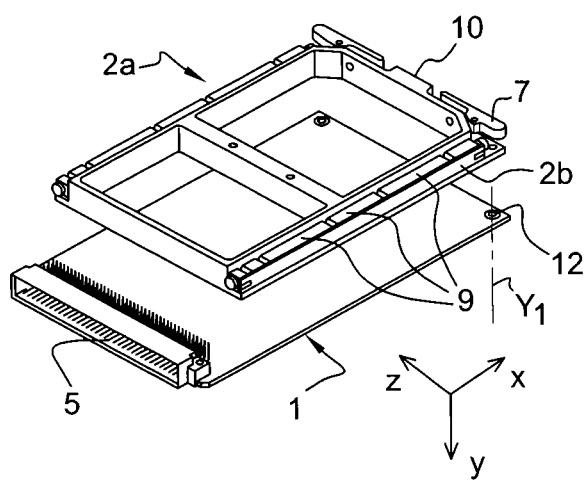
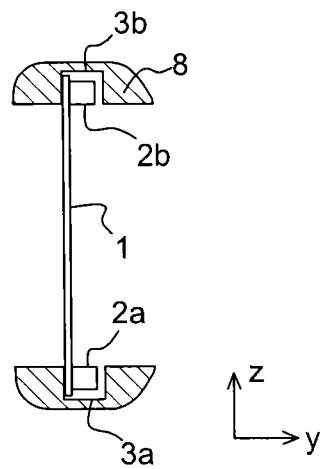
Fig. 1
Fig. 2
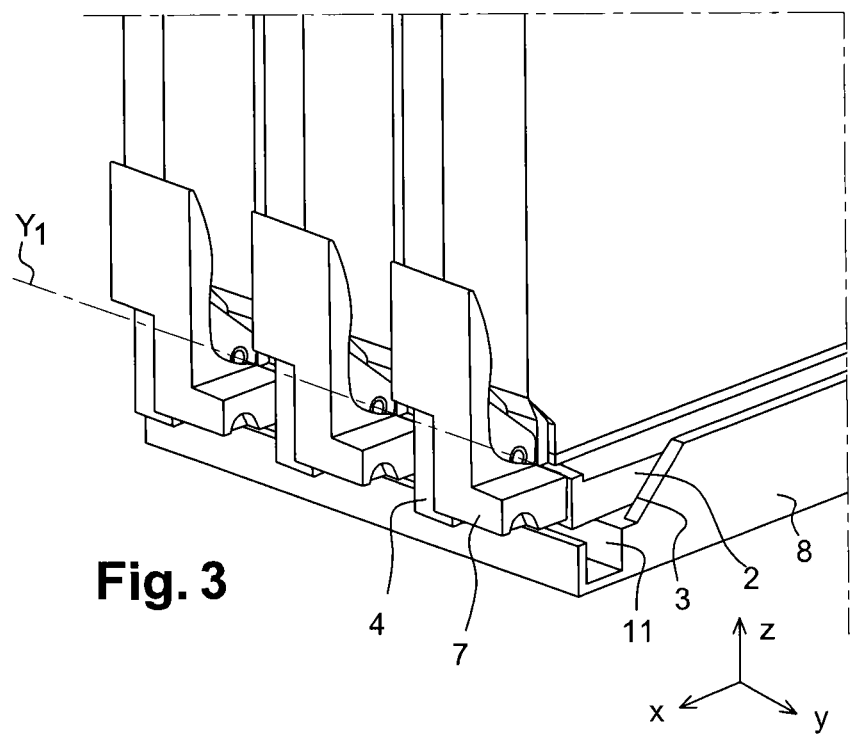
Fig. 3

LOCKING/UNLOCKING DEVICE FOR ELECTRONIC BOARDS LOCATED IN ONBOARD EQUIPMENT

PREAMBLE AND PRIOR ART

In many domains, especially aeronautics, electronic onboard equipment in the form of board racks is commonly used and is known per se.

To build up a full piece of equipment, such as a calculator, electronic boards 1 are installed in an electronics cabinet, configured as a parallelepiped housing with two slotted plates guiding the boards, one upper plate 3b and one lower plate 3a and installed in the rack of an electronics cabinet (see FIG. 2). These electronic boards are arrayed parallel with each other and are plugged into connectors set into a backplane board that interconnects all the electronic boards and miscellaneous cables linked to other systems.

Each electronic board 1 generally has an extraction lever that is used to apply a pulling force on the board so as to disconnect its connector 5 from the backplane card (not shown in the drawings).

In order to prevent an undesired disconnection of an electronic board due to movements or vibrations of the vehicle in which these boards are brought onboard, these electronic boards 1 are generally equipped with locking slides 2 on both of their edges as shown in FIG. 1.

The lock slides 2a and 2b are assembled on a substantially rectangular frame 10 that is joined with the electronic board 1 through known methods and perform the following functions: mechanical functions, in particular by ensuring the vibrations resistance, electrical functions, by ensuring the electrical continuity between each electronic board 1 and the calculator rack 8, and thermal functions, by ensuring thermal conductivity between the electronic board and the calculator frame 8.

This type of lock slide 2a, 2b as presented for example under U.S. Pat. No. 1,217,539 (Underwood 1915) and U.S. Pat. No. 4,354,770 is made up of a succession of clamping elements 9 with inclined planes traversed by a locking element. When the locking element is engaged, for example through the action of a locking lever 7 that is part of the slide frame 10, the inclined planes of the clamping element 9 cause the locking slide 2a, 2b to widen. The result of this is a wedging by friction of the electronic board 1 in the corresponding slotted plate 3a, 3b. Inversely, loosening of the locking element releases the tension between the clamping elements 9 and causes the locking slide 2a, 2b to shrink in its slot 3a, 3b, which corresponds to the release of the electronic board 1.

It is preferable to not attempt removing the electronic board 1 from its position when it is still locked by the locking slides 2a, 2b in order to prevent any damage to the board.

EXPLANATION OF THE INVENTION

The object of the invention is a locking/unlocking device for electronic boards, the said boards being of a type fit to be inserted into an electronics cabinet with at least one slotted plate fit into the frame of the said electronics cabinet, the device comprising:
  a substantially rectangular frame adapted to be joined with an electronic board, with the frame containing at least one locking slide, fit to lock the electronic board onto the slotted plate by means of a locking device, movable between a so-called rest position and a so-called locking position.

A direct reference system being defined for this frame, said system comprising a longitudinal axis X parallel to the insertion direction of the frame in the electronic cabinet, and a vertical axis Z perpendicular to the other axis and situated on a plane parallel to the center plane of the frame, with a lateral axis Y perpendicular to these preceding axes.

An extracting lever that rotates between a rest position and a locking position around an axis Y1, parallel to the Y axis, said extracting lever fitted so as to allow the application of a force along the longitudinal X axis, between the frame and the mounting rack,
with the locking unit comprising an extension adapted to lie along the longitudinal axis X of the board, outside in relation to the extracting lever when the two levers are engaged in the locking position.

In this way, it is impossible to use the extraction lever without having engaged the locking unit.

The locking unit will preferentially be a lever that rotates around a lateral axis Y2 that is parallel to lateral axis Y1 of the extracting lever, offset from this axis toward the exterior of the frame and toward the top, with the locking lever comprising a lateral extension adapted to be placed outside of the extracting lever along the longitudinal X axis, due to the relative positions of the rotation axes Y1 and Y2, when the frame with an electronic board is inserted and locked, i.e. when the two levers are in the locking position. This arrangement prevents the extraction of an electronic board caused by an action on the extracting lever as long as the locking lever has not yet been actuated.

According to a preferred embodiment, the lateral extension has an internal surface specified as the surface intended to face the electronic board in the locked position, with the said internal surface comprising, in its part opposite to the Y2 rotation axis, a stop perpendicular to the middle plan of said internal surface. This stop makes it possible to hold the end of the extracting lever in an intermediate position between its rest and locking positions.

In an advantageous embodiment, the stop is of a height near the thickness of the end of the extracting lever. Such a height ensures that said stop effectively blocks the end of the extracting lever in a locking position.

Preferentially, the distance D2 between the Y2 axis and the stop is less than the distance D1 between the Y1 axis and the end of the extracting lever. This layout ensures that the trajectories of the end of the extracting lever and of the stop have an intersecting point.

More particularly in this case, D1 is advantageously around 80% of D2.

Even more particularly, circle C1 described by the end of the extracting lever, and circle C2, described by the stop of the locking lever during rotation of the said locking lever around its Y2 axis, intersect at an intersection point which corresponds to a position of the levers intermediate between their rest and locking positions.

In a particular embodiment, the intersection point corresponds to an angular position α0 of the extracting lever lying between 30° and 50°, and to an angular position β0 of the locking lever lying between 35° and 65°.

EXPLANATION OF DRAWINGS

The features and advantages of the invention will be better evaluated through the description below, which explains the characteristics of the invention by means of a non-limiting example of application.

The description is supported by the appended drawings, in which:

The aforementioned FIG. 1 shows a perspective view of an electronic board for onboard equipment featuring locking slides.

The also aforementioned FIG. 2 shows a front view of an electronic board for onboard equipment mounted on slotted plates.

FIG. 3 shows a perspective view of a group of three electronic boards arrayed within the electronics cabinet, with slotted plates and locking slides according to an embodiment of the invention

DETAILED DESCRIPTION OF ONE EMBODIMENT OF THE INVENTION

Figure 4A:
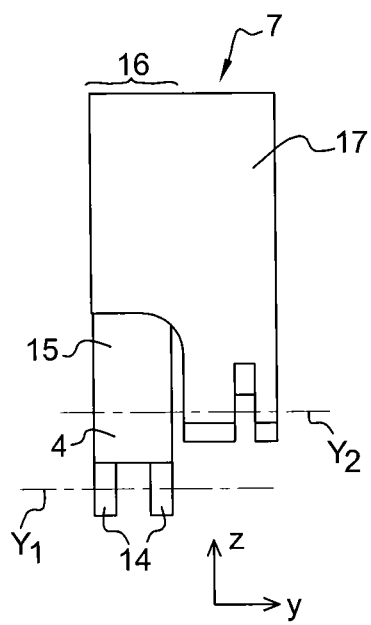
FIG. 4a shows a front view of the arrangement of the locking lever in relation to the extracting lever of an electronic board, set out in an arrangement that conforms to the invention

The invention is intended for equipments configured in the form of electronics cabinets containing a certain number of electronic boards 1. In the case of this invention as presented above, these electronic boards 1 are inserted along slots 3 in such a way that they can be easily inserted in, or extracted from, the backplane board located in the electronics cabinet.

FIG. 3 illustrates a setup of three electronic boards 1 in an operating position, when engaged and locked in slots of the rack 8 of an electronics cabinet.

As described above, each electronic board 1 is joined to a substantially rectangular frame 10 that is equipped with locking slides 2a, 2b.

A reference system is established regarding this frame 10 for the rest of the description, said system comprising A longitudinal axis parallel to the insertion direction of the board 1 and of the frame inside the electronics cabinet, i.e. parallel to one of the edges of the frame 10 and of the electronic board 1, and perpendicular to the back plane board that receives them A vertical axis Z perpendicular to the preceding axis and located on a plane parallel to the middle plane of the frame, i.e. parallel to a second edge of the frame 10

A lateral Y axis perpendicular to the preceding axes

The terms "front", "rear", "above", "below", etc. are defined with relation to this system.

In the embodiment described here as a non-limiting example, each electronic board 1 is inserted vertically, according to the plane XZ, in a slot 3 and connects to a backplane board by means of a connector 5. The slots 3 of the various electronic boards 1 are slots arranged into the lower plate of the rack 8 of the electronics cabinet. This lower plate features in its front part, opposite of the backplane board, a horizontal slot 11 parallel to the Y axis that extends in front of the forward edge of the electronic boards 1 when these boards are inserted into the electronics cabinet.

Each electronic board 1 has a bore 12, made along an Y1 axis parallel to the lateral Y axis, located in at least one of its angles opposite to its end holding the connector 5.

Figure 5:
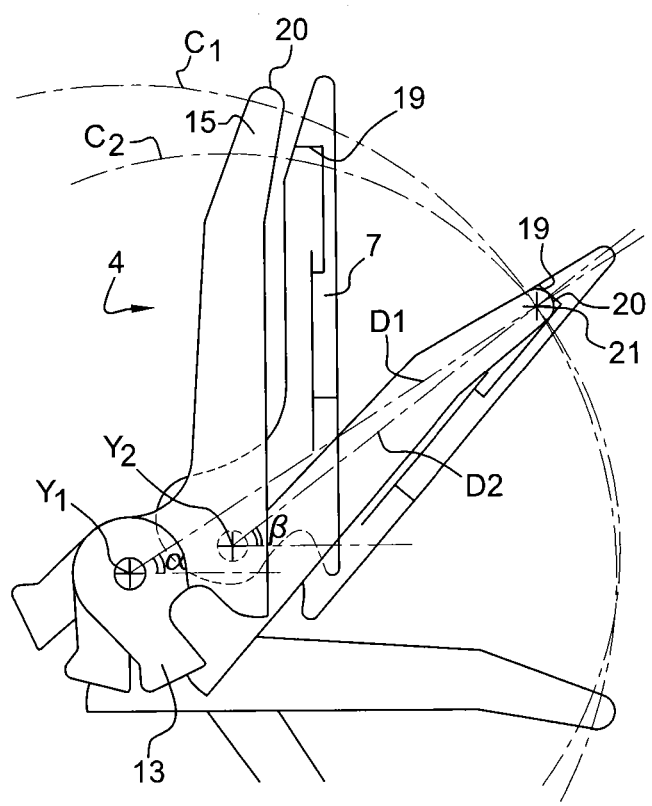
FIG. 5 shows a side view of the respective kinematics of the locking lever and the extracting lever.

An extraction lever 4 that rotates around this Y1 axis is installed on each electronic board 1. FIG. 4a illustrates that this extraction lever 4, shown in a front view with relation to the X axis, comprises two tabs 14 that are located on each side of the bore 12 during this installation. Likewise, this extraction lever 4, of which the profile is more visible in FIG. 5, features an extraction arm 15 that can occupy an angular position lying between a position parallel to the edge of the electronic board 1 and a position substantially perpendicular to the board. The trajectory described by the end 20 of the said extraction arm 15 is a circle C1 centered on the Y1 axis.

The extraction lever 4, of a form generally known per se, in this example comprises a protuberance 13 that comes to rest on the inside edge of the slot 11 when the electronic board 1 is inserted in its location.

Likewise, the protuberance 13 is pressed against the inside edge of the slot 11 when an effort is exerted on it to lower the said extraction lever 4. In this way, a significant lever arm is created between the electronic board 1 and the slot 11 of the rack 8, which disconnects the said electronic board 1 from the backplane board.

In the set up shown here, as in prior art, a locking slide 2 locks each electronic board 1 in place against its corresponding slot 3 by means of pressing its clamping planes (not shown in FIG. 3) against this same slot 3.

This clamping is the result of a locking lever 7 that presses the clamping planes longitudinally that are placed on a traction rod, with said clamping planes moving laterally because of their shape when pressure is exerted on them and coming to rest against the edges of the slotted plane 3.

In the non-limiting embodiment example provided here, the locking lever 7 moves around a rotation axis Y2 parallel to rotation axis Y1 of the extraction lever 4, but offset opposite to this lever toward the outside of the electronic board 1, according to the X axis, and above, according to the Z axis, i.e. it is closer to the horizontal axis plane of the said electronic board 1.

This Y2 rotation axis is joined to the end of the traction rod (not shown in the drawings) of the locking slide 2.

As shown in FIG. 4a, for each electronic board 1, the locking lever 7 is situated next to the extraction lever 4.

The locking lever 7 comprises a locking arm 17 that can occupy a position angularly located between a location parallel to the edge of the electronic board 1 and a downward position at an angle of around 60°. The trajectory described by the end of the said locking arm 17 is a circle centered on the Y2 axis.

The locking lever 7 here comprises a lateral extension 16, shown to the left of the locking arm 17 in FIG. 4a, intended to be placed in front of the extraction lever 4, i.e. more to the outside of the electronics cabinet, due to the relative position of the axes of rotation Y1 and Y2 when the electronic board 1 is locked in position, meaning when the two levers are locked in position.

The extraction arm 15 is then set between the electronic board 1 and the lateral extension 16 of the locking lever 7 when the electronic board 1 is inserted and locked in its location.

Figure 4B:
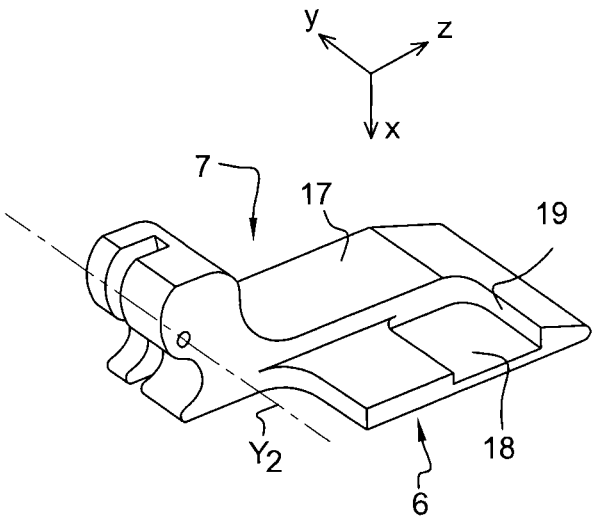
FIG. 4b shows a perspective view of the same lever for a locking slide.
Figure 4C:
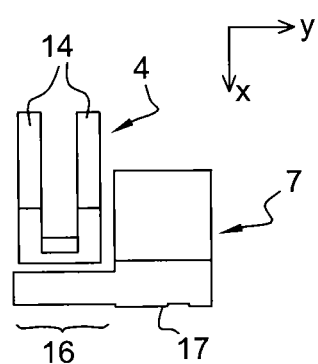
FIG. 4c shows a top view of the same lever for a locking slide.

This lateral extension 16 of the locking lever 7 thus constitutes an obstacle to the free rotation of the extraction lever 4. This lateral extension 16 is in the form of a substantially flat and rectangular piece (see FIG. 4b) that extends substantially over the entire length of the locking arm 17, i.e. over the entire length of the locking lever 7 outside of its path of movement around the Y2 axis. The width of the lateral extension 16 of the locking lever 17 is slightly greater than that of the extraction arm 15. In this way, once the locking lever 7 is set onto the frame 10 of the lock slides, the lateral extension 16 of the locking lever 7 interferes with the rotational movement of the extraction lever 4 around its Y1 axis.

The lateral extension 16 features a continuous external surface—with the external surfaced defined as that which is most distant from the electronic board when the said board is in the locked position—with the locking arm 17 and is also less thick than the locking arm 17, which abuts half of this arm in this example. In this way, the internal surface 18 of the lateral extension 16—with the internal surface defined as that which faces the electronic board 1 when said board is in the locked position—appears in counter relief to that of the locking arm 17.

This internal surface 18 comprises a stop 19 in its part opposite the Y2 axis of rotation that is perpendicular to the center plane of the said internal surface 18. This stop describes a circle C2 when the locking lever 7 moves around its Y2 axis (see FIG. 5). This stop 19 is of a height near to the thickness of the end 20 of the extraction arm 15. The stop 19 is flat here, but could be of any other shape that allows stopping the end 20 of the extraction arm 15.

The distance D2 between the Y2 axis and the stop 19 is intentionally lower than the distance D1 between the Y1 axis and the end 20 of the extraction arm 15. In this present embodiment example, D1 is approximately 80% of D2.

In this way, because of the location relative to the two axes of rotation Y1, for the extraction lever 4, and Y2, for the locking lever 7, circle C1 described by the end 20 of the extraction arm 15, and the circle C2, described by the stop 19 of the locking lever 7, intersect at a point 21. This point 21 corresponds to an angular position $\alpha_0$ of the extraction lever 4 and an angular position $\beta_0$ of the locking lever 7.

In this example of an embodiment, angle $a_0$ is approximately 40° and angle $\beta_0$ is approximately 45°.

Operating Mode

Figure 6A:
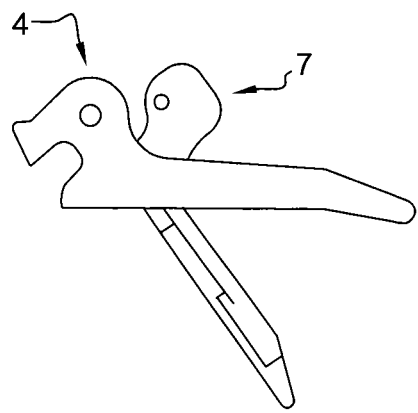
FIGS. 6a to 6h show the positions of the extraction lever and of the locking lever during the phase of insertion/locking of an electronic board in an electronics cabinet.
Figure 6B:
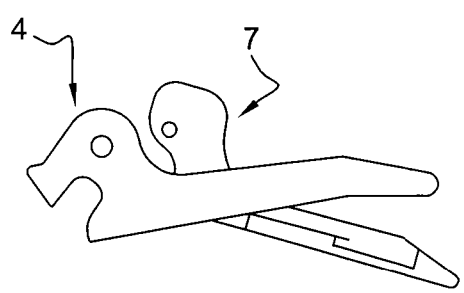
Figure 6C:
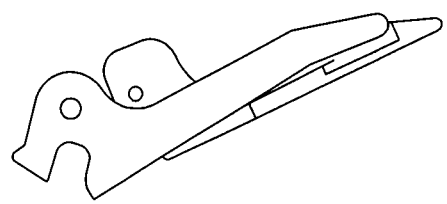
Figure 6D:
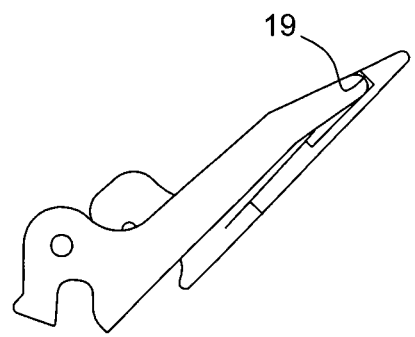
Figure 6E:
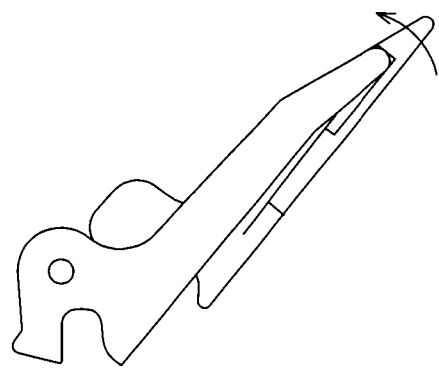
Figure 6F:
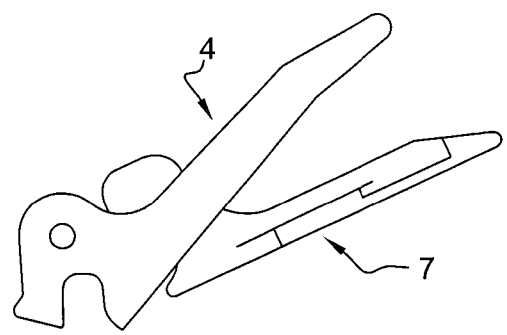
Figure 6G:
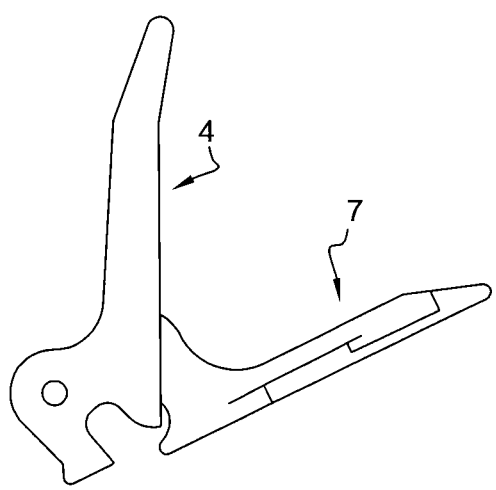
Figure 6H:
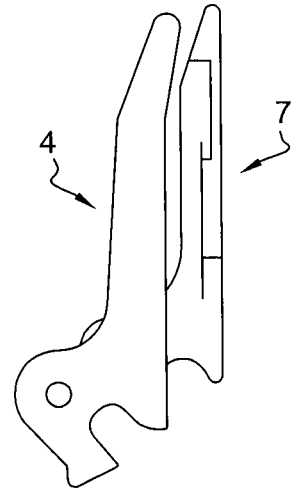

During operation, as shown in FIGS. 6a and 6h, starting from a position in which the electronic board 1 has been extracted as shown in FIG. 6a, with the locking slides 2a, 2b unlocked, corresponding to a substantially horizontal positioning of the extraction lever 4 ($\alpha=0°$) and a lowered positioning of the locking lever 7 ($\beta=45°$), it may be supposed that a user pushes the locking lever 7 upward with a resulting increase in angle $\beta$ to simultaneously insert and lock the electronic board 1 in its location.

As illustrated in FIG. 6b, the rotation movement of the locking lever 7 brings the lower edge 21 of the lateral extension 16 of this lever into contact with the external surface of the extraction lever 4. This brings about a simultaneous rotation movement of the two levers, as demonstrated in FIGS. 6c to 6e. In the position shown in FIG. 6e, where $\alpha=\alpha_0$ and $\beta=\beta_0$, the end 20 of the extraction arm 15 butts against the stop 19 of the lateral extension 16 of the locking lever 7. It is then impossible for the two levers to jointly pursue their movement. It is necessary to lower the locking lever 7, as shown in FIG. 6f, in order to insert the board by means of action of the extraction lever 4, as shown in FIG. 6g. The locking lever 7 is then brought to the locking position, as shown by FIG. 6h.

Advantages

By using the device herein described, it becomes impossible to remove the board without first unlocking it. Likewise, it becomes impossible to attempt to simultaneously insert the board into its connector and to engage the locking slides. The device makes it compulsory to follow a sequence in performing these actions, comprising first the insertion, then the locking of a board, or in reverse, by first unlocking, then removing the board.

The invention claimed is:

1. A locking/unlocking device for electronic boards, said boards to be inserted into an electronic cabinet with at least one slotted plate fit into the rack of said electronic cabinet, the locking/unlocking device comprising:
   a substantially rectangular frame, adapted to form part of the electronic board, said frame supporting at least one locking slide that locks the electronic board onto the slotted plate through the action of a locking lever that moves between a rest position and a locking position;
   a direct reference system for the frame, said system comprising a longitudinal axis X parallel to the insertion direction of the frame in the electronics cabinet, and a vertical axis Z perpendicular to the axis X and situated on a plane parallel to the center plane of the frame, with a lateral axis Y perpendicular to the X and Z axis; and
   an extracting lever that rotates between a rest position and a locking position around a fixed Y1 axis and parallel to the Y axis, said extracting lever fitted so as to allow the application of a force along the longitudinal X axis between the electronic board, or the frame and the mounting rack,
   wherein the locking lever includes an extension adapted to lie outside in relation to the extracting lever along the longitudinal axis X of the board when the locking lever and extracting lever are engaged in the locking position,
   wherein the extracting lever and the locking lever engage at an intersection point, which corresponds to a position of the levers intermediate between their rest and locking positions.

2. The locking/unlocking device according to claim 1, wherein the locking lever rotates around a lateral axis Y2 that is parallel to lateral axis Y1 of the extracting lever, offset from said axis toward the exterior of the frame and above, with the locking lever comprising a lateral extension adapted to be placed outside of the extracting lever along the longitudinal X axis due to the relative positions of the rotation axes Y1 and Y2 when the frame with an electronic board is in the inserted and locked position, wherein the locking lever and extracting lever are in the locking position.

3. The locking/unlocking device according to claim 2, wherein the lateral extension has an internal surface specified as the surface intended to face the electronic board in the locked position, with the said internal surface comprising, in its part opposite of the Y2 rotation axis, a stop perpendicular to the middle plane of the internal surface.

4. The locking/unlocking device according to claim 2, wherein the stop is of a height near to the thickness of the end of the extraction lever.

5. The locking/unlocking device according to claim 2, wherein the distance D2 between the Y2 axis and the stop is intentionally lower than the distance D1 between the Y1 axis and the end of the extraction lever.

6. The locking/unlocking device according to claim 5 wherein the distance D1 is approximately 80% of D2.

7. The locking/unlocking device according to claim 2, wherein a circle (C1) described by the end of the extracting lever, and the a circle (C2), described by the stop of the locking lever during rotation of said locking lever around its (Y2) axis, intersect at the intersection point.

8. The locking/unlocking device according to claim 7, wherein the intersection point corresponds to an angular position α0 of the extracting lever lying between 30° and 50°, and to an angular position β0 of the locking lever lying between 35° and 65°.

\* \* \* \* \*